United States Patent
Hasegawa et al.

(10) Patent No.: US 9,590,439 B2
(45) Date of Patent: Mar. 7, 2017

(54) CONTROL DEVICE OF BATTERY CHARGING

(71) Applicant: TOYOTA JIDOSHA KABUSHIKI KAISHA, Toyota-shi, Aichi (JP)

(72) Inventors: Hajime Hasegawa, Susono (JP); Keisuke Omori, Kariya (JP); Kazuhito Kato, Sunto-gun (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 75 days.

(21) Appl. No.: 14/432,367

(22) PCT Filed: Oct. 22, 2012

(86) PCT No.: PCT/JP2012/077240
§ 371 (c)(1),
(2) Date: Mar. 30, 2015

(87) PCT Pub. No.: WO2014/064750
PCT Pub. Date: May 1, 2014

(65) Prior Publication Data
US 2015/0255998 A1 Sep. 10, 2015

(51) Int. Cl.
*H02J 7/00* (2006.01)
*H02J 7/04* (2006.01)
(Continued)

(52) U.S. Cl.
CPC ........... *H02J 7/007* (2013.01); *B60L 11/1857* (2013.01); *B60L 11/1875* (2013.01);
(Continued)

(58) Field of Classification Search
USPC ........................................................ 320/132
See application file for complete search history.

(56) References Cited

U.S. PATENT DOCUMENTS 6,661,203 B2 * 12/2003 Wolin ................... H02J 7/0091
320/128
8,395,356 B2 * 3/2013 Schaefer ........... H01M 10/0525
320/134
(Continued)

FOREIGN PATENT DOCUMENTS

JP 4-10366 A 1/1992
JP 4-137369 A 5/1992
(Continued)

*Primary Examiner* — Samuel Berhanu
(74) *Attorney, Agent, or Firm* — Sughrue Mion, PLLC (57) ABSTRACT

A main object of the present invention is to provide a control device of battery charging capable of quickly charging a battery to an intended capacity while inhibiting occurrence of defect in the battery, the control device including a first output unit outputting a heating signal to heat a battery, a second output unit outputting a charging signal to charge the battery heated according to the heating signal, and a controller judging whether or not a degree of degradation of the battery is a first value or more, wherein where the controller judges the degree of degradation to be the first value or more, the controller controls the heating signal to make the charging rate of the battery whose degree of degradation is the first value or more equal to or closer to a charging rate of the battery when the degree of degradation is less than the first value.

3 Claims, 8 Drawing Sheets (51) Int. Cl.
  *B60L 11/18*   (2006.01)
  *G01R 31/36*   (2006.01)
  *H01M 10/48*   (2006.01)
  *H01M 10/44*   (2006.01)

(52) U.S. Cl.
  CPC ..... *G01R 31/3675* (2013.01); *G01R 31/3679* (2013.01); *H02J 7/04* (2013.01); *H01M 10/443* (2013.01); *H01M 10/486* (2013.01); *H02J 7/047* (2013.01)

(56) References Cited

U.S. PATENT DOCUMENTS

| | | | | |
|---|---|---|---|---|
| 2008/0036425 | A1* | 2/2008 | Tashiro | H01M 10/486 320/154 |
| 2008/0290835 | A1* | 11/2008 | Hayashi | H01M 2/1022 320/112 |
| 2009/0121685 | A1* | 5/2009 | Eto | H01M 10/443 320/152 |
| 2011/0156652 | A1 | 6/2011 | Kishiyama et al. | |
| 2011/0316486 | A1* | 12/2011 | Inaba | B60L 1/003 320/150 |
| 2013/0187614 | A1* | 7/2013 | Bhardwaj | H01M 10/443 320/134 |

FOREIGN PATENT DOCUMENTS

| | | |
|---|---|---|
| JP | 8-115747 A | 5/1996 |
| JP | 2011-138767 A | 7/2011 |

* cited by examiner

CONTROL DEVICE OF BATTERY CHARGING

CROSS REFERENCE TO RELATED APPLICATIONS

This application is a National Stage of International Application No. PCT/JP2012/077240 filed Oct. 22, 2012, the contents of all of which are incorporated herein by reference in its entirety.

TECHNICAL FIELD

The present invention relates to a control device of battery charging.

BACKGROUND ART

A lithium-ion secondary battery has a higher energy density and is operable at a high voltage compared to conventional secondary batteries. Therefore, it is used for information devices such as a cellular phone, as a secondary battery which can be easily reduced in size and weight, and nowadays there is also an increasing demand for the lithium-ion secondary battery to be used as a power source for electric vehicles and hybrid vehicles.

The lithium-ion secondary battery includes a cathode layer, an anode layer, and an electrolyte layer arranged between them. An electrolyte to be used in the electrolyte layer is, for example, a non-aqueous liquid or a solid. When the liquid is used as the electrolyte (hereinafter, the liquid being referred to as "electrolytic solution"), it easily permeates into the cathode layer and the anode layer. Therefore, an interface can be easily formed between the electrolytic solution and active materials contained in the cathode layer and the anode layer, and the battery performance can be easily improved. However, since commonly used electrolytic solutions are flammable, it is necessary to have a system to ensure safety. On the other hand, if a nonflammable solid electrolyte (hereinafter referred to as "solid electrolyte") is used, the above system can be simplified. As such, a lithium-ion secondary battery provided with a layer containing a solid electrolyte has been suggested (hereinafter, the layer being referred to as "solid electrolyte layer" and the battery being referred to as "all-solid-state battery").

As a technique related to such a lithium-ion secondary battery, for example Patent Literature 1 describes quickly charging a lithium-ion secondary battery prepared with a polymer electrolyte, by means of a heating element set as having a temperature of 60° C. adhered to an outer surface of the battery. Patent Literature 2 describes heating a secondary battery prepared with a polymer electrolyte to 50° C. to charge the battery. Also, Patent Literature 3 describes heating a battery for driving an electric vehicle to 30° C. thereafter charging the battery.

CITATION LIST

Patent Literatures

Patent Literature 1: Japanese Patent Application Laid-Open No. H04-10366
Patent Literature 2: Japanese Patent Application Laid-Open No. H04-137369
Patent Literature 3: Japanese Patent Application Laid-Open No. H08-115747

SUMMARY OF INVENTION

Technical Problem

It can be considered that a quick charge can be carried out by employing the techniques disclosed in Patent Literatures 1 to 3. In this regard, degradation of a battery proceeds when the battery is heated, and as the degradation of the battery proceeds, the maximum charging rate (maximum charging current value) of the battery at which the battery can be charged to an intended state of charge (SOC. The same is applied hereinafter) without having any defects (in a case where the battery is a lithium-ion secondary battery, defects such as Li precipitation. The same is applied hereinafter) is decreased. However, in the techniques disclosed in Patent Literatures 1 to 3, the degree of battery degradation is not considered. Thus, if inhibition of defects in the battery is prioritized, the SOC when the charging is finished may be kept to be a low value or the charging current value may be needlessly set as a small value (the charging rate may be set needlessly slow). Also, if inhibition of the decrease of the charging rate is prioritized, defects may occur in the battery. Thus, with the techniques disclosed in Patent Literatures 1 to 3, it is difficult to quickly charge a battery to a high state of charge, while inhibiting occurrence of defects in the battery.

Accordingly, an object of the present invention is to provide a control device of battery charging capable of quickly charging a battery to an intended capacity while inhibiting occurrence of defects in the battery.

Solution to Problem

As a result of an intensive study, the inventors of the present invention have found that: in a case where an all-solid-state battery is charged to a predetermined SOC without having Li precipitation, the battery can be charged to an intended SOC without having Li precipitation if the degree of degradation of the all-solid-state battery is low, even if the charging current value is relatively increased. The inventors also have found that: in order to charge a degraded all-solid-state battery to a high SOC with the charging current value increased and without causing Li precipitation, it is effective to charge the battery with the temperature of the battery increased. Further, the inventors have found that: regarding an all-solid-state battery in which degradation has proceeded to a degree that Li precipitation occurs before an intended SOC is obtained when the battery is charged with the charging current value increased and with the temperature increased, it is possible to charge the battery to the intended SOC while inhibiting Li precipitation, by charging the battery in a state in which the charging current value is decreased or in a state in which both the charging current value and the temperature of the all-solid-state battery are decreased. The present invention has been made based on the above findings.

In order to solve the above problems, the present invention takes the following means. Namely, a first aspect of the present invention is a control device of battery charging including: a first output unit outputting a heating signal to heat a battery; a second output unit outputting a charging signal to charge the battery heated according to the heating signal; and a controller judging whether or not a degree of degradation of the battery is a first value or more, wherein where the controller judges the degree of degradation to be the first value or more, the controller controls the heating signal so as to make the charging rate of the battery whose degree of degradation is the first value or more equal to or closer to a charging rate of the battery when the degree of degradation is less than the first value.

In the first aspect of the present invention, the configuration of the "battery" is not particularly limited, and for example an all-solid-state battery can be preferably used. Also, in the first aspect of the present invention, machinery with which the "battery" is equipped can have one or more selected from the group consisting of the first output unit, the second output unit, and the controller, or can have none of them. In a case where the machinery with which the battery is equipped does not have the first output unit, the second output unit, or the controller, for example the first output unit can be provided to a heating device which heats the battery, and provided outside the machinery with which the battery is equipped. The second output unit and the controller can be provided to a feeding device or the like which feeds electricity into the battery, such as a charger. Also, in the first aspect of the present invention and other aspects of the present invention shown below (hereinafter, these aspects may be collectively referred to as "the present invention"), the term "degree of degradation" can be obtained by a charging curve (a curve which shows a relationship between voltage and battery capacity, wherein the voltage is taken along the vertical axis and the battery capacity is taken long the horizontal axis), a battery resistance obtainable from a response of pulse current, and the like. Also, in the present invention, the "first value" is not particularly limited, and arbitrarily determined by a manufacturer of the battery, manufacturer of the charger, manufacturer of battery-equipped machinery and the like. The specific value of the first value differs depending on the structure and a use mode of the battery, the thinking way regarding the allowable degree of degradation, and the like. For example, the first value can be a value obtained when the performance is degraded by at least 0.01% and around 5% from the initial performance. According to the first aspect of the present invention, by controlling the temperature of the battery whose degree of degradation is the first value or more according to the heating signal, it is possible to inhibit occurrence of defects in the battery, even if the battery is charged at the same rate as the charging rate when a battery which can exert its initial performance is quickly charged. Therefore, such a configuration makes it possible to provide a control device of battery charging capable of quickly charging a battery to an intended capacity while inhibiting occurrence of defects in the battery.

A second aspect of the present invention is a control device of battery charging including: a first output unit outputting a heating signal to heat a battery equipped on a vehicle; a second output unit outputting a charging signal to charge the battery heated according to the heating signal; and a controller judging whether or not a degree of degradation of the battery is a first value or more and being equipped on the vehicle, wherein where the controller judges the degree of degradation to be the first value or more, the controller controls the heating signal so as to make the charging rate of the battery whose degree of degradation is the first value or more equal to or closer to a charging rate of the battery when the degree of degradation is less than the first value. Even with a configuration in which the controller equipped with the vehicle with which the battery is equipped controls the temperature of the battery to be charged, it is possible to exert the same effect as that of the first aspect of the present invention. Therefore, such a configuration also makes it possible to provide a control device of battery charging capable of quickly charging a battery to an intended capacity while inhibiting occurrence of defects in the battery.

A third aspect of the present invention is a control device of battery charging including: a first output unit outputting a heating signal to heat a battery equipped on a vehicle; a second output unit outputting a charging signal to charge the battery heated according to the heating signal; and a controller judging whether or not a degree of degradation of the battery is a first value or more and being equipped with a feeding device feeding electricity into the battery, the feeding device being arranged outside the vehicle, wherein where the controller judges the degree of degradation to be the first value or more, the controller controls the heating signal so as to make the charging rate of the battery whose degree of degradation is the first value or more equal to or closer to a charging rate of the battery when the degree of degradation is less than the first value. Even with the configuration in which the temperature of the battery to be charged is controlled by the controller equipped with the feeding device, it is possible to exert the same effect as that of the first aspect of the present invention. Therefore, such a configuration also makes it possible to provide a control device of battery charging capable of quickly charging a battery to an intended capacity, while inhibiting occurrence of defects in the battery.

Also, in the first aspect to the third aspect of the present invention, it is preferable that the controller controls the heating signal so as to raise temperature of the battery. Such a configuration makes it easy to maintain the charging rate of the battery, whereby it becomes easy to quickly charge the battery to an intended capacity, while inhibiting occurrence of defects in the battery.

Also, in the first aspect to the third aspect of the present invention, it is preferable that where the controller judges the degree of degradation to be equal to or greater than a second value which is greater than the first value, the controller controls the heating signal and/or the charging signal, so as to make the charging rate of the battery slower than a charging rate of the battery when the degree of degradation is no less than the first value and less than the second value. If the battery whose degradation has proceeded to the second value or more is heated and subjected to a continuous quick charge, defects can occur to the battery before the intended SOC is obtained. According to the present invention in which the degree of degradation is made to be slower than the charging rate of the battery when the degree of degradation is no less than the first value and less than the second value, where the degree of degradation of the battery is equal to or greater than the second value, it is easy to prevent a situation in which defects occur in the battery.

Advantageous Effect of Invention

According to the present invention, it is possible to provide a control device of battery charging capable of quickly charging a battery to an intended capacity, while inhibiting occurrence of defects in the battery.

DESCRIPTION OF EMBODIMENTS

In a case where the charging of battery is finished when a specific SOC is obtained, if the degree of degradation of the battery to be charged is low, the battery is easily charged to the intended SOC while preventing occurrence of defects in the battery, even though the battery is quickly charged with the charging current value increased. In contrast, if the battery in which the degradation has proceeded (battery having a degree of degradation X of no less than the first value X1) is quickly charged at the same temperature and the same charging current value as those in charging the battery having a low degree of degradation (battery having a degree of degradation X less than the first value X1), defects can occur to the battery before the intended SOC is obtained. In order to prevent this situation, it is effective to increase the ion conductivity of the battery in which the degradation has proceeded, and it is possible to increase the ion conductivity of the battery by increasing the temperature of the battery. Thus, in order to quickly charge the battery having a degree of degradation X of no less than the first value X1, it is effective to quickly charge the battery with the temperature of the battery increased. However, if the degradation of the battery further proceeds to have a degree of degradation X of no less than the second value X2, a defect can occur to the battery before the intended SOC is obtained, even though the battery is charged with the temperature of the battery increased. In a case where the defect of the battery is Li precipitation for example, it is difficult to return the state of the battery once had the defect, to the state before the defect occurs. Therefore, in order to prevent occurrence of defects in the battery, it is effective to make the charging rate slower by reducing the charging current value. As described above, the battery having a degree of degradation X of no less than the second value X2 can inhibit occurrence of defects in the battery by making the charging rate slower; however, if the battery is charged with the temperature of the battery increased, the degradation of the battery tends to proceed. For this reason, in a case where the degradation has proceeded to a degree with which defects can occur in the battery when the reduced charging rate is maintained (in a case where the degree of degradation X of the battery is equal to or greater than a third value X3 which is greater than the second value X2), it is preferable that the battery is charged with the slower charging rate by reducing the charging current value and the temperature of the battery decreased. As described above, it is possible to quickly charge a battery to an intended capacity while preventing occurrence of defects in the battery, by: when the degree of degradation is low, maintaining a state having a high charging rate by heating the battery as needed; and when the battery reaches a state that it is difficult to maintain the high charging rate as a result of progression of the degree of degradation, charging the battery with the charging rate reduced.

Figure 1:
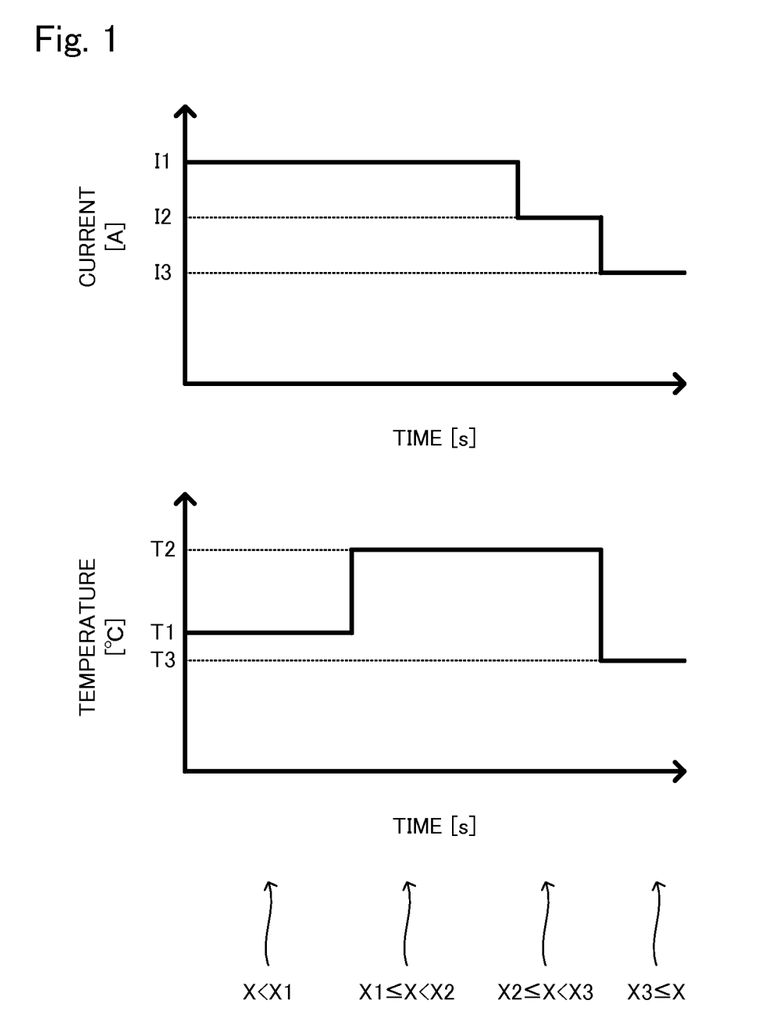
FIG. 1 includes a graph to explain an example of a control form of the charging current value and the temperature of the battery in the present invention.

FIG. 1 shows an example of a control form of the charging current value and the temperature of the battery in the present invention. The graph on an upper side on the sheet of paper explains a relationship between the charging current value and the time, and the graph on a lower side on the sheet of paper explains a relationship between the temperature of the battery and the time. I1, I2, and I3 in FIG. 1 represent the charging current value, and they satisfy the relationship of I3<I2<I1. Also, T1, T2, and T3 in FIG. 1 each represents the temperature of the battery, and they satisfy the relationship of T3≤T1<T2. In the present invention, if the battery satisfies X<X1, the battery is quickly charged at a temperature of T1 and a charging current value of I1, and if the battery satisfies X1≤X<2, the battery is quickly charged at a temperature of T2 and a charging current value I1. And, for example if the battery satisfies X2≤X<X3, the battery is charged at a temperature of T2 and a charging current value I2, and if the battery satisfies X3≤X, the battery is charged at a temperature of T3 and a charging current value I3. By charging a battery as described, it is possible to quickly charge a battery to an intended capacity while preventing occurrence of defects in the battery.

It is considered that a need for a quick charge increases in a case where an on-vehicle battery is charged and the like. Therefore, the charging control having the above form can be carried out specifically when an on-vehicle battery is charged. However, the battery to be quickly charged in the present invention is not limited to the on-vehicle battery, and it can be a battery for other use than for a vehicle.

Figure 2:
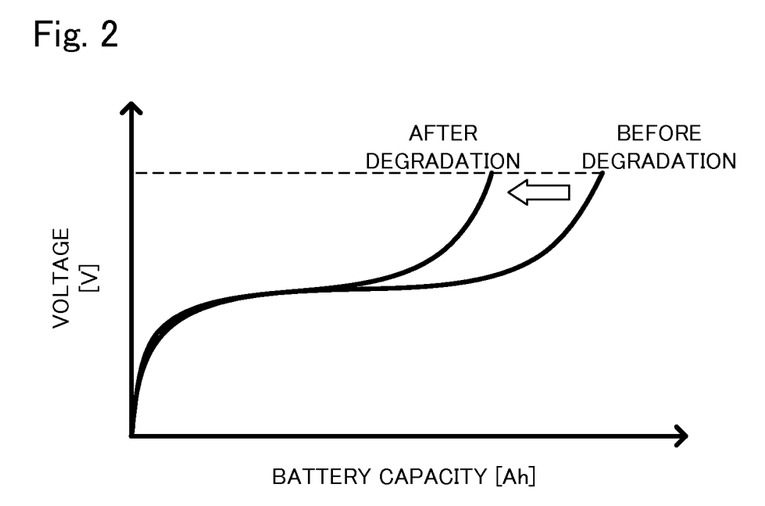
FIG. 2 is a graph showing an example of the charging curve.
Figure 3:
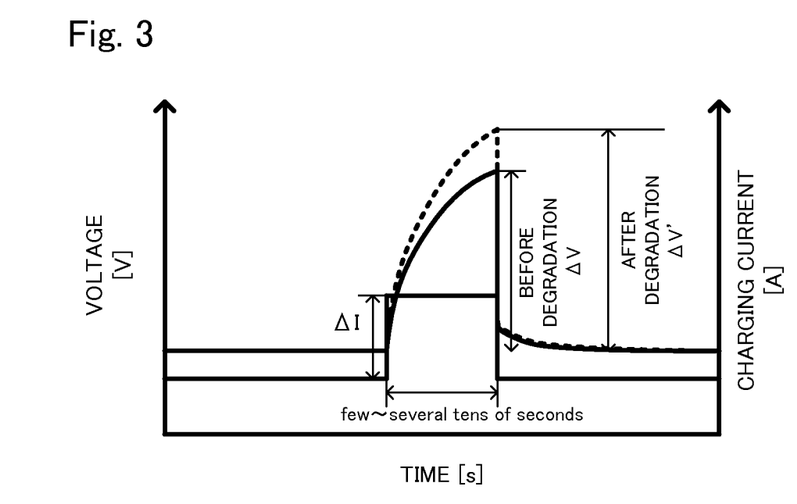
FIG. 3 is a graph showing an example of the result of response of pulse current.

In order to carry out the above charging control of the present invention, (1) obtaining the degree of degradation X of the battery, (2) increasing the temperature of the battery by means of a heating device such as a heater, (3) specifying the heating temperature (the temperature of the battery after the battery is heated), (4) specifying the charging current value after reduced, and (5) specifying the temperature of the battery after reduced, and the like are required. Among them, (1) can be carried out for example by measuring the degree of degradation X in every time the battery is charged. In a case where the degree of degradation X is specified by means of the charging curve, the degree of degradation X can be specified by: specifying in advance the charging curve of a battery which can exert its initial performance (initial battery); making the charging curve of the battery to be charged, by means of the temperature of the battery and the charging current value when the charging curve of the initial battery is specified; thereafter calculating the difference between the battery capacity of the charged battery when the voltage reaches the intended value after charging and the battery capacity of the initial battery when the voltage reaches the intended value after charging. FIG. 2 shows an example of the charging curves of the initial battery and the charged battery. In FIG. 2, the voltage [V] is taken along the vertical axis and the battery capacity [Ah] is taken along the horizontal axis. On the other hand, in a case where the degree of degradation X is specified from the battery resistance, the degree of degradation X can be obtained by: specifying the relationship between the battery resistance and the capacity; thereafter, for example measuring the battery resistance of the initial battery and the battery resistance of the charged battery by means of the response of pulse current; and obtaining the capacity of the charged battery by means of the measured battery resistance of the charged battery. FIG. 3 shows an example of the responses of pulse current of the initial battery and the charged buttery. In FIG. 3, the voltage [V] is taken along the vertical axis on the left side, the charging current [A] is taken along the vertical axis on the right side, and the time [s] is taken along the horizontal axis. When the current change is determined as ΔI, the voltage change of the initial battery is determined as ΔV, and the voltage change of the charged battery is determined as ΔV', the battery resistance of the initial battery is ΔV/ΔI, and the battery resistance of the charged battery is ΔV'/ΔI.

Figure 4:
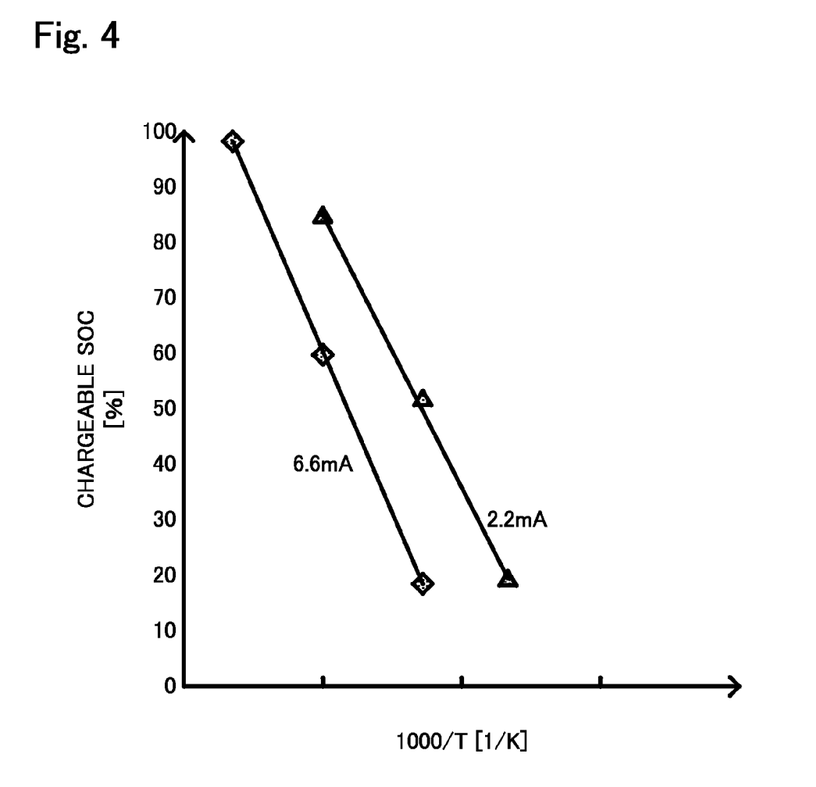
FIG. 4 is a graph showing an example of a charging control map.

Also, the above (3) to (5) can be carried out for example by making in advance a charging control map. The charging control map shows a relationship of the charging current value, the temperature of the battery, and the maximum SOC capable of charging the battery without causing defects (hereinafter the SOC may be referred to as "chargeable SOC"). FIG. 4 shows an example of the charging control map. In FIG. 4, the chargeable SOC [%] is taken along the vertical axis, and the reverse number [1/K] of the temperature is taken along the horizontal axis. For convenience, FIG. 4 only shows graphs of two current values. However, for the charging control map to be used in carrying out the present invention, many graphs of different current values can be written.

In the present invention, the place to store the charging control map is not particularly limited. The charging control map can be stored in a computer such as an ECU (Engine Control Unit. The same is applied hereinafter) provided to the vehicle with which the battery is equipped, or can be stored in a computer equipped with a feeding device such as a charger to be used in charging the on-vehicle battery. Information regarding the temperature of the battery after changed, which is specified from the charging control map, is transferred for example from the output unit (first output unit) of the computer which stores the charging control map to a known heating device such as a heater, to control the output of the heating device. Whereby, it is possible to control the temperature of the battery. In the present invention, the configuration of the heating device in the above (2) is not particularly limited, and the heating device can be equipped with a vehicle, can be equipped with a feeding device such as a charger, or can be provided to an apparatus other than a vehicle or a feeding device. Also, in the present invention, the charging signal for charging the battery can be transferred from the output unit (second output unit) of the feeding device such as a charger to the battery.

Hereinafter, the present invention is specifically described with reference to an example in which the present invention is carried out for a purpose of quickly charging an on-vehicle battery. In the following explanation, the degree of degradation of the battery to be charged may be noted as X, the first value of the degree of degradation may be noted as X1, the second value of the degree of degradation may be noted as X2, and the third value of the degree of degradation may be noted as X3. It should be noted that the embodiments shown below are examples of the present invention, and the present invention is not limited to these embodiments.

1. First Embodiment

Figure 5:
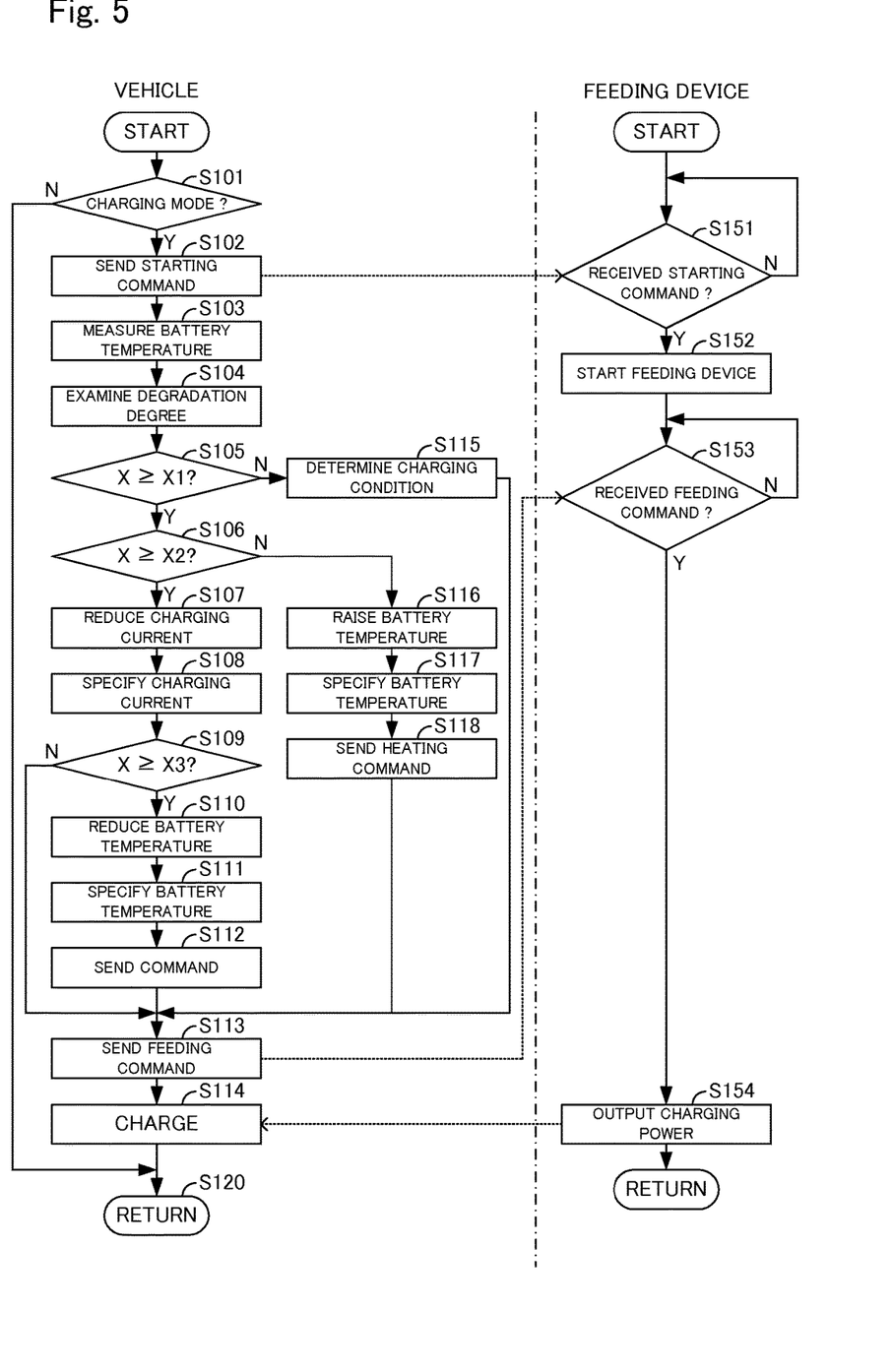
FIG. 5 is a flowchart to explain an example of control according to one embodiment of the present invention.

FIG. 5 is a flowchart to explain a control example by means of a control device of battery charging according to one embodiment of the present invention. In the configuration shown in FIG. 5, depending on the computer (e.g. ECU) provided to a vehicle with which the battery is equipped, it is judged whether or not X is X1 or more, whether or not X2 or more, whether or not X3 or more. Then, the heating signal is outputted from the heating device which received the signal from the on-vehicle computer, and the charging signal is outputted from the feeding device which received the signal from the on-vehicle computer. Whereby, the on-vehicle battery is charged. That is, in the first embodiment, the computer provided to the vehicle functions as the controller.

In the configuration shown in FIG. 5, whether or not the vehicle is in a charging mode to charge the battery is judged (step S101) by the controller equipped with the vehicle. In a case where a negative judgment is made in the step S101, the vehicle is in a non-charging mode, where the battery is not charged; therefore the process moves to the step S120 without carrying out the successive subsequent processes.

In a case where an affirmative judgment is made in the step S101, the vehicle is in the charging mode, where the battery is charged; therefore a starting command to give a command to start the feeding device is sent from the controller equipped with the vehicle to the feeding device (step S102). Once the starting command is sent to the feeding device, the temperature of the battery is measured (step S103); thereafter the degree of degradation of the battery is examined (step S104). The temperature measurement of the step S103 can be carried out by means of a known temperature sensor. The examination of the degree of degradation of the step S104 can be carried out for example by the above-mentioned method (the method using the charging curve and the method using the response of pulse current), and the degree of degradation X of the battery is specified in the step S104. Once the degree of degradation X of the battery is specified as above, whether or not the degree of degradation X is X1 or more is judged in the controller (step S105). In a case where an affirmative judgment is made in the step S105, the defect in the battery can occur when the battery is quickly charged under the same conditions as in quickly charging a battery capable of exerting its initial performance. Therefore the charging conditions such as the temperature of the battery to be charged need to be changed, in order to keep the charging rate. Thus, if an affirmative judgment is made in the step S105, it is judged whether or not the degree of degradation X has a value of X2 or more by the controller (step S106). In contrast, in a case where a negative judgment is made in the step S105, which means the degree of degradation is insignificant, there is a high possibility that the battery can be quickly charged to the intended SOC without causing defects in the battery, even though the quick charge is carried out under the same conditions as in quickly charging a battery capable of exerting its initial performance. Accordingly, in a case where the negative judgment is made in the step S105, the charging condition is determined for example by specifying the maximum value I1 capable of charging the battery to the intended SOC at the predetermined temperature T1, by means of the charging control map stored in the ECU and the like (hereinafter, in the explanation of the first embodiment, the map is simply referred to as "charging control map") (step S115). After the charging conditions are determined as described, the process moves to the step S113.

In a case where an affirmative judgment is made in the step S106, it can be regarded that the degradation of the battery has proceeded to a degree that the battery is difficult to be quickly charged with the temperature of the battery increased. Therefore, in a case where an affirmative judgment is made in the step S106, the command to make the battery temperature as T2 is outputted to the heating device to increase the temperature of the battery, thereafter the current value is set to a smaller value (I2) than the current value I1 with which the battery of X≤X2 is quickly charged (step S107). The charging current value I2 of the battery to which an affirmative judgment is made in the step S106 can be specified by means of the charging control map (step S108). On the other hand, in a case where a negative judgment is made in the step S106, the degree of degradation X of the battery is X1≤X<X2. By carrying out charging with the temperature of the battery increased, the battery in this state can be quickly charged to the intended capacity while preventing occurrence of defects in the battery. Therefore, in a case where a negative judgment is made in the step S106, the temperature of the battery is increased (step S116). The battery temperature T2 after increased can be specified by means of the charging control map. For example, the minimum battery temperature required to charge the battery to the intended SOC is specified by means of the line of the current value I1 written on the charging control map in quickly charging a battery capable of exerting its initial performance; and the obtained temperature is determined as the battery temperature T2 after the battery is heated (step S117). After specifying the battery temperature T2 after the battery is heated in the step S117, a heating command is transmitted to the heating device in order to heat the battery to this temperature (step S118). After determining charging conditions as above, the process moves to the step S113.

The charging current value is specified in the step S108. Then, it is judged whether or not the degree of degradation X of the battery is X3 or more (step S109). In a case where an affirmative judgment is made in the step S109, it can be considered that the degradation of the battery has so proceeded that it is difficult to charge the battery with the temperature increased. Therefore, in a case where an affirmative judgment is made in the step S109, the battery temperature is set lower than T2 (step S110). The temperature T3 lower than T2 can be specified by means of the charging control map. Further, the charging current value I3 is also specified by means of the charging control map (step S111). After specifying the battery temperature T3 and the charging current value I3 in the step S111, a command is transmitted to the heating device in order to control the battery temperature to the temperature T3 (step S112). After the charging conditions are determined as described, the process moves to the step S113. On the other hand, in a case where a negative judgment is made in the step S109, the degree of degradation X of the battery is X2≤X<X3. The battery in this state can be regarded as able to be charged in a state with the temperature increased. Therefore, the charging condition in a case where a negative judgment is made in the step S109 is determined as the battery temperature of T2 and the charging current value of I2, and the process moves to the step S113.

After the charging conditions are determined as above, a command regarding the charging current value is transmitted from the controller of the vehicle to the feeding device in order to charge the battery under the conditions (step S113), thereafter the charging is carried out (step S114).

On the other hand, when the feeding device receives the starting commend transmitted from the controller of the vehicle (when an affirmative judgment is made in the step S151), the feeding device is started to work by the controller of the feeding device (step S152). After that, when the command regarding the charging current value transmitted from the controller of the vehicle is received (when an affirmative judgment is made in the step S153), the charging current controlled by the controller of the feeding device is outputted to the battery equipped with the vehicle (step S154), whereby the charging is carried out. The feeding device is not started while a negative judgment is made in the step S151, and the charging current is not outputted to the battery equipped with the vehicle while a negative judgment is made in the step S153.

By having an interaction between the vehicle and the feeding device as described above, it is possible to control the charging of the battery with the configuration shown in FIG. 1. Therefore, with the present invention according to the first embodiment, it is possible to quickly charge an on-vehicle battery to an intended capacity while preventing occurrence of defects in the on-vehicle battery.

2. Second Embodiment

Figure 6:
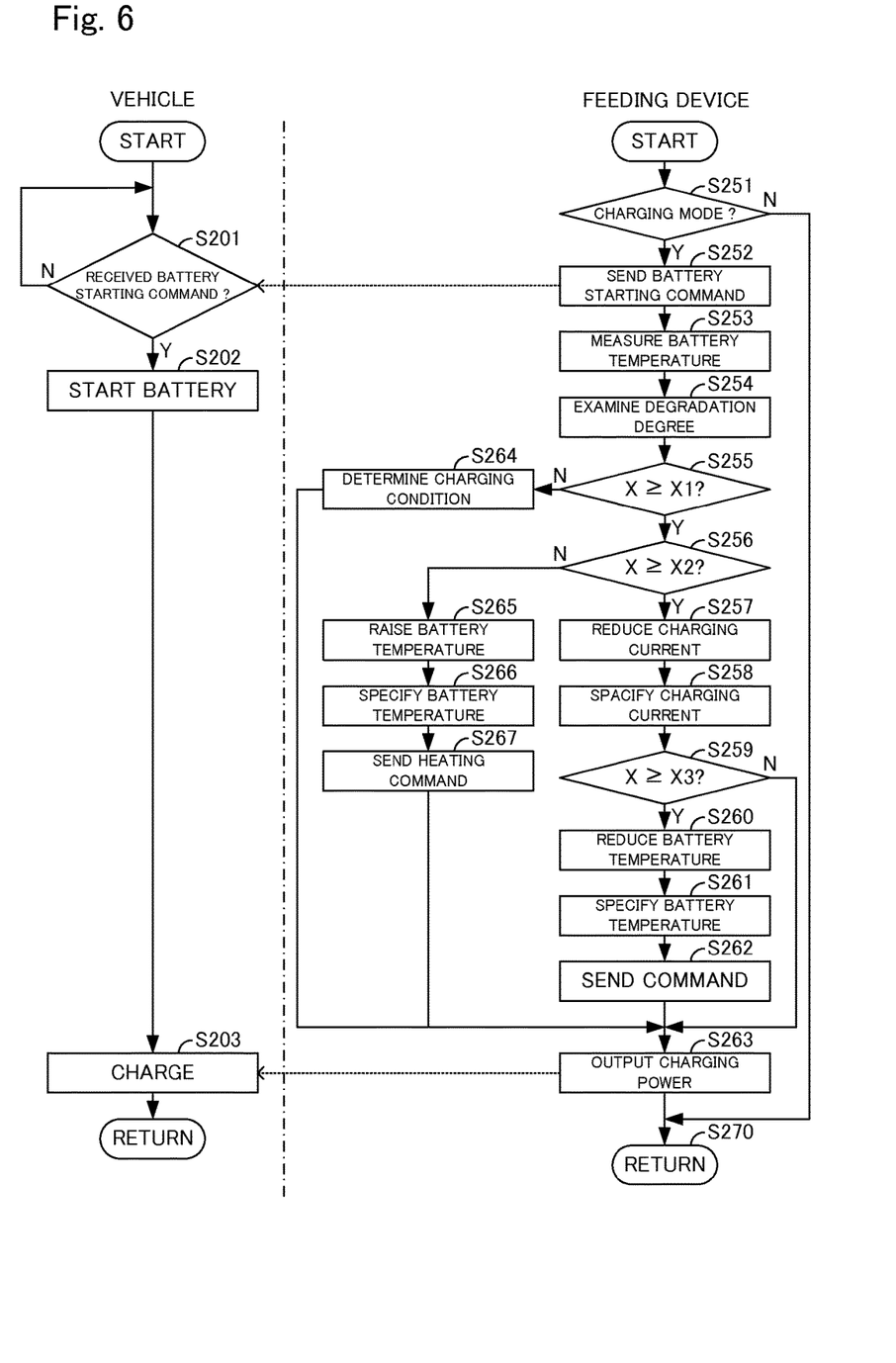
FIG. 6 is a flowchart to explain an example of control according to another example of the present invention.
Figure 7:
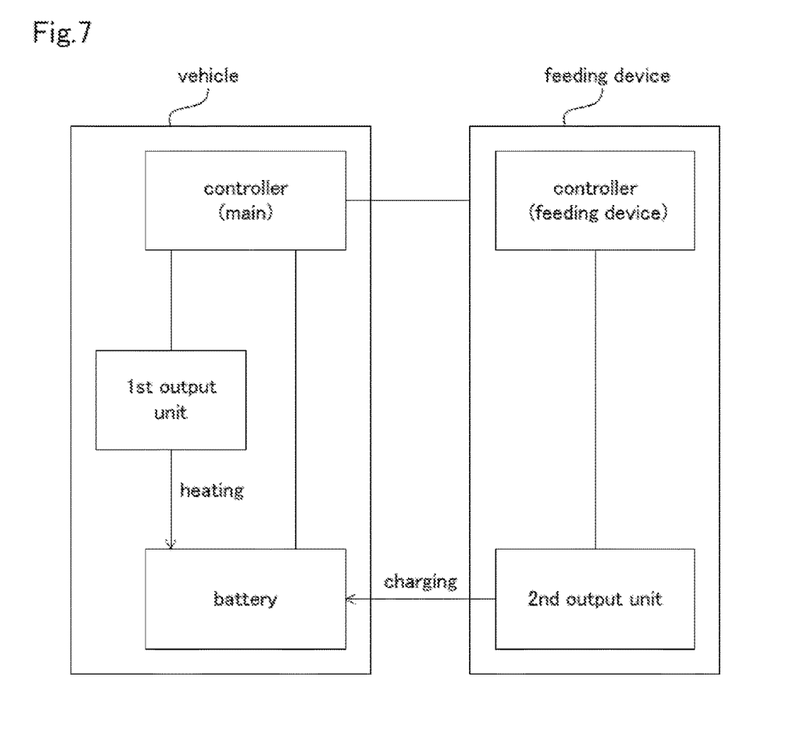
FIG. 7 is a block diagram showing the second output unit outputting a charging signal to charge the battery.
Figure 8:
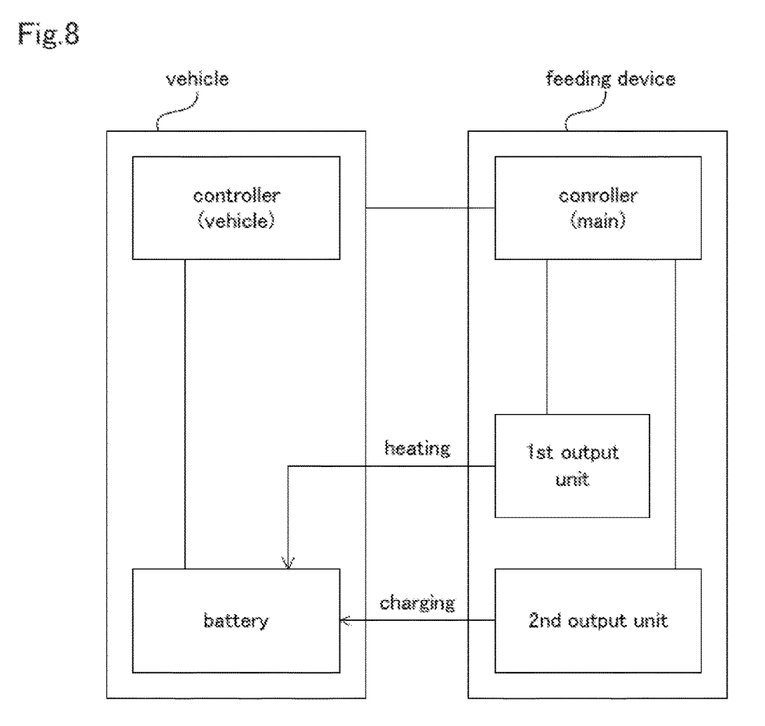
FIG. 8 is a block diagram showing the first output outputting a heating signal to heat the battery.

FIG. 6 is a flowchart to explain a control example of a control device of battery charging according to another embodiment of the present invention. With the embodiment shown in FIG. 6, whether or not X is X1 or more, whether or not X is X2 or more, and whether or not X is X3 or more are judged by the controller equipped with the feeding device (e.g. charger. The same is applied hereinafter). The heating device which received the signal from the controller outputs a heating signal, and the feeding device provided with the controller outputs a charging signal. Whereby, the on-vehicle battery is charged. That is, in the second embodiment, the computer provided to the feeding device functions as the controller.

In the embodiment shown in FIG. 6, whether or not the battery is in a charging mode to be charged is judged by the controller equipped with the feeding device (step S251). When an affirmative judgment is made in the step S251, the battery is in a non-charging mode where the on-vehicle battery is not to be charged. Therefore, the process moves to the step S270 without carrying out the following successive steps.

In a case where an affirmative judgment is made in the step S251, the on-vehicle battery is in the charging mode to be charged. Therefore, the controller of the feeding device sends a starting command to the on-vehicle battery, to thereby give the command of starting the battery (step S252). After the starting command is sent to the on-vehicle battery, the battery temperature is measured (step S253), thereafter the degree of degradation of the battery is examined (step S254). The temperature measurement in the step S253 can be carried out by means of a known temperature sensor. The examination of the degree of degradation in the step S254 can be carried out for example by means of the above-mentioned method (the method using a charging curve or a method using a pulse current response). In the step S254, the degree of degradation X of the battery is specified. After the degree of degradation X of the battery is specified as described, the controller judges whether or not the degree of degradation X is no less than X1 (step S255). In a case where an affirmative judgment is made in the step S255, a defect of the battery can be caused, if the battery is quickly charged under the same conditions as those in quickly charging a battery which can exert its initial performance. Therefore, in order to keep the charging rate, the charging conditions such as the battery temperature to be charged need to be changed. For this reason, if an affirmative judgment is made in the step S255, the controller subsequently judges whether or not the degree of degradation X is no less than X2 (step S256). On the contrary, in a case where a negative judgment is made in the step S255, which means the degree of degradation of the battery is small, the battery is more likely to be charged quickly to an intended SOC under the same conditions as those in charging the battery which can exert its initial performance, without causing any defects in the battery. Therefore, in a case where a negative judgment is made in the step S255, the charging conditions are determined (step S264), for example by specifying the maximum current value I1 with which the battery can be charged to the intended SOC at a predetermined temperature T1, by means of the charging control map stored in the controller of the feeding device and the like (hereinafter, in the explanation of the second embodiment, the map is simply referred to as "charging control map"). After the charging conditions are determined as described, the process moves to the step S263.

In a case where an affirmative judgment is made in the step S256, the battery can be considered as so degraded that the battery is difficult to be quickly charged with the temperature of the battery increased. Therefore, when an affirmative judgment is made in the step S256, a command is outputted to the heating device to make the battery temperature T2, to increase the battery temperature, thereafter the current value is set to a smaller value (I2) than the current value I1 with which the battery satisfying X≤X2 is quickly charged (step S257). The charging current value I2 of the battery to which an affirmative judgment is made in the step S256 can be specified by means of the charging control map (S258). On the other hand, in a case where a negative judgment is made in the step S256, the degree of degradation X of the battery is X1≤X<X2. The battery in this state can be quickly charged to the intended capacity while preventing occurrence of a defect, by charging the battery with the temperature increased. Therefore, when a negative judgment is made in the step S256, the battery temperature is increased (step S265). The battery temperature T2 after increased can be specified by means of the charging control map. For example, by using a line of the current value I1 in quickly charging the battery which can exert its initial performance, a minimum battery temperature needed to charge the battery to the intended SOC is specified, and the temperature is determined as the battery temperature T2 after the battery is heated (step S266). After the battery temperature T2 after the battery is heated is specified in the step S266, a heating command is sent to the heating device in order to heat the battery to the temperature T2 (Step S267). After the battery conditions are determined as described, the process moves to the step S263.

After the charging current value is specified in the step S258, it is subsequently judged whether or not the degree of degradation X of the battery is no less than X3 (step S259). In a case where an affirmative judgment is made in the step S259, the battery can be considered to be so degraded that the battery is difficult to be charged with the temperature of the battery increased. Therefore, when an affirmative judgment is made in the step S259, the temperature of the battery is set lower than T2 (step S260). The temperature T3 lower than T2 can be specified by means of the charging control map. The charging current value I3 is also specified by means of the charging control map (step S261). After the battery temperature T3 and the charging current value I3 are specified in the step S261, a command is sent to the heating device, to control the battery temperature to the temperature T3 (step S262). After the charging conditions are determined as described, the process moves to the step S263. On the other hand, in a case where a negative judgment is made in the step S259, the degree of degradation X of the battery is X2≤X<X3. The battery in this state can be considered as able to be charged with the temperature increased. Therefore, the charging conditions in a case where a negative judgment is made in the step S259 are set to be the battery temperature of T2 and the charging current value of I2, thereafter the process moves to the step S263.

After the charging conditions are determined as described, the controller of the feeding device outputs a charging power to the on-vehicle battery (step S263), in order to charge the battery under the charging conditions. Whereby, the charging is carried out.

On the other hand, in the vehicle, receiving the starting command sent from the controller of the feeding device (when an affirmative judgment is made in the step S201), the controller of the vehicle starts the on-vehicle battery (step S202). After that, the charging power outputted from the feeding device is received to be charged (step S203). The battery is not started while a negative judgment is made in the step S201.

By having an interaction between the vehicle and the feeding device as above, it is possible to control the battery charging with the configuration shown in FIG. 1. Therefore, with the present invention according to the second embodiment, it is possible to quickly charge an on-vehicle battery to an intended capacity while preventing occurrence of defects in the on-vehicle battery.

In the above explanation regarding the present invention according to the first embodiment and the present invention according to the second embodiment, a configuration in which the charging is started after the battery temperature is increased to a target temperature is exemplified. However, the present invention is not limited to this configuration. In a case where a long time is required to raise the battery temperature to the target temperature, as the battery reaches a predetermined temperature lower than the target temperature, it is possible to start charging the battery with a charging current value with which the battery can be charged to a chargeable SOC at the temperature. Then, if the battery temperature does not reach the target temperature when the battery temperature is measured again after the charging is started, the charging is carried out with a charging current value with which the battery can be charged to the chargeable SOC at the temperature. By repeating these steps, it is possible to have a configuration in which the battery is charged at the charging current value corresponding to the measured temperature, even before the battery temperature reaches the target temperature. Whether the charging is started after increasing the battery temperature to the target temperature or before reaching the target temperature can be determined by calculating the time required for completing charging in each case, to choose the case requiring a shorter time. In the present invention, the battery temperature which reaches the target temperature is kept at a constant value by means of a known heating device such as a heater.

In addition, in the above explanation regarding the present invention, a configuration in which a charging control map which shows a relationship of the charging current value, battery temperature, and chargeable SOC is used when the battery temperature and the charging current value are determined is exemplified. However, the present invention is not limited to this configuration. The present invention can have a configuration in which the battery temperature and charging current value are determined by means of a graph showing a relationship between the battery temperature and the ion conductivity of the solid electrolyte, and a graph showing a relationship between the ion conductivity of the solid electrolyte and the chargeable SOC. In addition, the present invention can have a configuration in which the battery temperature and the charging current value are determined by means of a graph showing a relationship between the battery temperature and the ion conductivity of the anode layer, and a graph showing a relationship between the ion conductivity of the anode layer and the chargeable SOC.

The configuration of the battery whose charging is to be controlled by the present invention is not particularly limited. For example, an all-solid-state battery can be preferably used. In the present invention, as the cathode active material to be contained in the cathode layer of the battery, a cathode active material which can be used in an all-solid-state battery can be adequately used. Examples of the cathode active material can include a layered active material such as: lithium cobalt oxide ($LiCoO_2$) and lithium nickelate ($LiNiO_2$); lithium manganate ($LiMn_2O_4$); different kind element substituent Li—Mn spinel whose component is shown as $Li_{1+x}Mn_{2-x-y}M_yO_4$ (M is one or more selected from the group consisting of Al, Mg, Co, Fe, Ni, and Zn; $0 \leq x \leq 0.06$, $0.03 \leq y \leq 0.15$); lithium titanate ($Li_xTiO_y$, $0.36 \leq x \leq 2$, $1.8 \leq y \leq 3$); lithium metal phosphate ($LiMPO_4$; M is one or more selected from the group consisting of Fe, Mn, Co, and Ni), and the like. The cathode active material can be in a particle shape, a thin-film shape, and the like for example. The average particle diameter of the cathode active material (D50) is preferably 1 nm or more and 100 μm or less for example, and more preferably 10 nm or more and 30 μm or less.

In addition, in the present invention, the cathode layer and anode layer of the battery can include a known solid electrolyte which can be used in an all-solid-state battery, if necessary. Examples of such a solid electrolyte can include oxide-based amorphous solid electrolytes such as $Li_2O$—$B_2O_3$—$P_2O_5$ and $Li_2O$—$SiO_2$, sulfide-based amorphous solid electrolytes such as $Li_2S$—$SiS_2$, $LiI$—$Li_2S$—$SiS_2$, $LiI$—$Li_2S$—$P_2S_5$, $LiI$—$Li_2S$—$P_2O_5$, $LiI$—$Li_3PO_4$—$P_2S_5$, and $Li_2S$—$P_2S_5$, crystalline oxides and crystalline oxynitrides such as LiI, $Li_3N$, $Li_5La_3Ta_2O_{12}$, $Li_7La_3Zr_2O_{12}$, $Li_6BaLa_2Ta_2O_{12}$, $Li_3PO_{(4-3/2w)}N_w$ (w<1), and $Li_{3.6}Si_{0.6}P_{0.4}O_4$. In view of making a battery whose performance is easily improved and the like, it is preferable to use a sulfide solid electrolyte for the solid electrolyte.

In a case where a sulfide solid electrolyte is used as the solid electrolyte, it is preferable that the cathode active material is covered by an ion conductive oxide, in view of having a configuration in which the battery resistance is easy to be prevented from increasing, by making it difficult to form a high resistance layer at the interface between the cathode active material and the solid electrolyte. It is only necessary that the lithium ion conductive oxide which covers the cathode active material has a lithium ion conductivity and contains a material with which the covering layer can maintain its form of not flowing even though the layer have contact with the active material and the solid electrolyte. Examples of such a lithium ion conductive oxide can include an oxide represented by the general formula $Li_xAO_y$(A is B, C, Al, Si, P, S, Ti, Zr, Nb, Mo, Ta, or W; x and y are positive numbers). Specifically, $Li_3BO_3$, $LiBO_2$, $Li_2CO_3$, $LiAlO_2$, $Li_4SiO_4$, $Li_2SiO_3$, $Li_3PO_4$, $Li_2SO_4$, $Li_2TiO_3$, $Li_4Ti_5O_{12}$, $Li_2TiO_5$, $Li_2ZrO_3$, $LiNbO_3$, $Li_2MoO_4$, $Li_2WO_4$, and the like can be given. In addition, in a case where the surface of the cathode active material is covered by the ion conductive oxide, it is only necessary that the ion conductive oxide covers at least a part of the cathode active material. The ion conductive oxide can cover the whole surface of the cathode active material. The thickness of the ion conductive oxide which covers the cathode active material is preferably 0.1 nm or more and 100 nm or less for example, and more preferably 1 nm or more and 20 nm or less. The thickness of the ion conductive oxide can be measured by means of a transmission type electron microscope (TEM) and the like for example.

In addition, the cathode layer can be produced by means of a known binder which can be contained in a cathode layer of a lithium ion secondary battery. Examples of such a binder can include butadiene rubbers (BR), polyvinylidene fluoride (PVdF), styrene butadiene rubbers (SBR), and the like.

Further, the cathode layer can contain a conductive material to improve conductivity. Examples of the conductive material which can be contained in the cathode layer can include carbon materials such as a vapor deposition carbon fiber, acetylene black (AB), Ketjen black (KB), carbon nanotube (CNT), carbon nanofiber (CNF), and metal materials which can endure the environment in using an all-solid-state battery. In a case where the cathode layer is produced by means of a cathode composition in a slurry form adjusted by dispersing the above cathode active material, solid electrolyte, binder, and the like in a liquid, heptane and the like can be exemplified as the liquid which can be used, and a non-polar solvent can be preferably used. In addition, the thickness of the cathode layer is preferably 0.1 μm or more and 1 mm or less for example, and more preferably 1 μm or more and 100 μm or less. Further, in order to make it easy to improve the performance of the all-solid-state battery, the cathode layer is preferably produced with a process of pressing. In the present invention, the pressure to press the cathode layer can be approximately 100 MPa.

In addition, as the anode active material to be contained in the anode layer of the battery, a known anode active material which can absorb/release lithium ions can be adequately used. Examples of such an anode active material can include a carbon active material, oxide active material, metal active material, and the like. The carbon active material is not particularly limited as long as it contains carbon. For example, mesocarbon microbeads (MCMB), highly oriented graphite (HOPG), hard carbons, soft carbons, and the like can be given. As the oxide active material, for example $Nb_2O_5$, $Li_4Ti_5O_{12}$, SiO and the like can be given. As the metal active material, for example Si, Si alloys and the like can be given. The anode active material can be formed in a particle shape, or a thin-film shape for example. The average particle diameter (D50) of the anode active material is preferably 1 nm or more and 100 μm or less for example, and more preferably 10 nm or more and 30 μm or less.

Further, the anode layer can contain a binder to bond the anode active material and the solid electrolyte, and a conductive material, to improve conductivity. As the binder and the conductive material that can be contained in the anode layer, the above-described binder and conductive material that can be contained in the cathode layer can be exemplified. In addition, in a case where the anode layer is produced by means of an anode composition in a slurry form adjusted by dispersing the above anode active material and the like in a liquid, heptane and the like can be exemplified as the liquid to disperse the anode active material and the like, and a non-polar solvent can be preferably used. The thickness of the anode layer is preferably 0.1 μm or more and 1 mm or less for example, and more preferably 1 μm or more and 100 μm or less. In addition, in order to make it easy to improve the performance of the all-solid-state battery, the anode layer is preferably produced with a process of pressing. In the present invention, the pressure to press the anode layer is preferably 200 MPa or more, and more preferably approximately 400 MPa.

In addition, in a case where an all-solid-state battery is used as the battery whose charging is controlled by the present invention, as the solid electrolyte to be contained in the solid electrolyte layer, a known solid electrolyte which can be used for an all-solid-state battery can be adequately used. Examples of such a solid electrolyte can include the above-described solid electrolyte which can be contained in the cathode layer and anode layer. Other than this, the solid electrolyte layer can contain a binder to bond the solid electrolyte to each other, in view of exerting plasticity or the like. Examples of such a binder can include the above-described binder which can be contained in the cathode layer and the like. It should be noted that, the content of the binder to be contained in the solid electrolyte layer is preferably 5 mass % or less, in view of making it possible to form the solid electrolyte layer having the solid electrolyte evenly dispersed and prevented from excessive aggregation, for attaining a high output power. In addition, in a case where the solid electrolyte layer is produced with a process of applying the solid electrolyte composition in a slurry form adjusted by dispersing the above-described solid electrolyte and the like in a liquid to the cathode layer, anode layer, and the like, heptane and the like can be exemplified as the liquid to disperse the solid electrolyte and the like, and a non-polar solvent can be preferably used. The content of the solid electrolyte material in the solid electrolyte layer is, by mass %, preferably 60% or more, more preferably 70% or more, and especially preferably 80% or more for example. The thickness of the solid electrolyte layer is, largely different depending on the structure of the battery, preferably 0.1 μm or more and 1 mm or less for example, and more preferably 1 μm or more and 100 μm or less.

For the current collector to be connected to the cathode layer, a known metal which can be used as a cathode current collector of a battery can be used. Examples of such a metal can include a metal material including one or two or more elements selected from the group consisting of Cu, Ni, Au, Pt, Al, Fe, Ti, and Zn.

For the current collector to be connected to the anode layer, a known metal which can be used as an anode current collector of a battery can be used. Examples of such a metal include a metal material including one or two or more elements selected from the group consisting of Cu, Ni, Fe, Ti, Co, and Zn.

In addition, the battery formed with the above materials can be used in a state of being sealed in a housing such as a laminate film. Examples of the laminate film can include a laminate film made of resin and a film in which a metal is deposited on a laminate film made of resin.

As described above, in the present invention, the charging control map that shows a relationship of the charging current value, battery temperature, and chargeable SOC can be used for determining the battery temperature and the charging current value. This charging control map can specify the capacity just before an abnormal charging occurs. After an all-solid-state battery provided with each layer produced with the above materials and methods is produced, for example by charging the battery at a constant current and constant voltage for example from 3 V to 4.55V, under plural conditions in which the setting values of the battery temperature and the charging current value are different, the capacity can be specified as the chargeable SOC with each setting value of the battery temperature and the charging current value.

Also, in the present invention, in determining the battery temperature and the charging current value, a graph showing a relationship between the battery temperature and the ion conductivity of the solid electrolyte, and a graph showing a relationship between the ion conductivity of the solid electrolyte and the chargeable SOC can be used. Here, the measurement method of the ion conductivity of the solid electrolyte is not particularly limited. For example, the ion conductivity of the solid electrolyte can be determined by: producing the solid electrolyte layer with a process of pressing; producing a layered body in which the obtained solid electrolyte layer is sandwiched by a pair of carbon coated Al films and pressed; thereafter determining the intersection with the real number axis in the vicinity of 100 kHz measured by means of an AC impedance as a resistance; dividing the value of the resistance by the thickness of the solid electrolyte layer; and obtaining the inverse number of the resultant value as the ion conductivity of the solid electrolyte.

Also, in the present invention, in determining the battery temperature and the charging current value, a graph showing a relationship between the battery temperature and the ion conductivity of the anode layer, and a graph showing a relationship between the ion conductivity of the anode layer and the chargeable SOC can be used. Here, the measurement method of the ion conductivity of the anode layer is not particularly limited. For example, the ion conductivity of the anode layer can be measured by means of the following method. That is:
firstly, producing an anode layer sandwiched by a pair of solid electrolyte layers; then, producing a layered body including the anode layer with an In foil inserted to one end and a Li foil inserted to the other end of the anode layer; thereafter, leaving the layered body including the anode layer at a predetermined temperature and for a predetermined time; thereafter, passing direct current of 0.5 mA for 30 seconds, to thereby obtain the voltage difference $\Delta V$ before and after the current is applied; from the relationship between this $\Delta V$ and the current 0.5 mA, obtaining a resistance R1 of the layered body including the anode layer; next, producing a layered body which is formed in the same manner as that of the above layered body except that the anode layer is not included; in the same manner as that of the layered body which includes the anode layer, obtaining a resistance R0 of the layered body which does not include the anode layer;
the ion conductivity resistance of the anode layer can be considered as R1−R0; the ion conductivity of the anode layer is the inverse number of the value obtained by dividing R1−R0 by the thickness of the anode layer.

In the above explanation regarding the present invention, a configuration in which the battery whose charging is controlled by the present invention is a lithium-ion secondary battery is exemplified; however, the present invention is not limited to this configuration. The battery whose charging is controlled by the present invention can have a configuration in which ions other than lithium ions move between the cathode layer and the anode layer. Examples of such ions can include sodium ions, potassium ions, and the like. In a case where the ions other than lithium ions move, the cathode active material, the electrolyte, and the anode active material can be adequately chosen depending on the ions which move between the cathode layer and the anode layer.

The invention claimed is:
1. A control device of battery charging comprising:
a first output unit outputting a heating signal to heat a battery;
a second output unit outputting a charging signal to charge the battery heated according to the heating signal; and a controller judging whether or not a degree of degradation X of the battery is a first value X1 or more, wherein when the controller judges the degree of degradation X to be the first value X1 or more, the controller controls the heating signal so as to raise a temperature of the battery, so as to make the charging rate of the battery whose degree of degradation X is no less than the first value X1 equal to or closer to a charging rate of the battery when the degree of degradation is less than the first value X1;

when the controller judges the degree of degradation X to be equal to or greater than a second value X2 which is greater than the first value X1, the controller controls the heating signal or the charging signal or a combination thereof so as to make the charging rate of the battery slower than a charging rate of the battery when the degree of degradation X is no less than the first value X1 and less than the second value X2;

when the controller judges the degree of degradation X to be equal to or greater than a third value X3 which is greater than the second value X2, the controller controls the heating signal and the charging signal, so as to make the charging rate of the battery slower than a charging rate of the battery when the degree of degradation X is no less than the second value X2 and less than the third value X3, and so as to charge the battery with the temperature of the battery decreased;

wherein the controller controls the heating signal and the charging signal, so as to charge the battery satisfying $X<X1$ with a battery temperature T1 and a charging current I1, charge the battery satisfying $X1 \leq X<X2$ with a battery temperature T2, charge the battery satisfying $X2 \leq X<X3$ with the charging temperature T2 and a charging current I2, and charge the battery satisfying $X3 \leq X$ with a battery temperature T3 and a charging current I3;

the charging current I1, I2, and I3 satisfy $I3<I2<I1$; and the battery temperature T1, T2, and T3 satisfy $T3 \leq T1<T2$.

2. A control device of battery charging comprising:

a first output unit outputting a heating signal to heat a battery equipped on a vehicle;

a second output unit outputting a charging signal to charge the battery heated according to the heating signal; and a controller judging whether or not a degree of degradation X of the battery is a first value X1 or more and being equipped on the vehicle, wherein when the controller judges the degree of degradation X to be the first value X1 or more, the controller controls the heating signal so as to raise a temperature of the battery, so as to make the charging rate of the battery whose degree of degradation X is no less than the first value X1 equal to or closer to a charging rate of the battery when the degree of degradation is less than the first value X1;

when the controller judges the degree of degradation X to be equal to or greater than a second value X2 which is greater than the first value X1, the controller controls the heating signal or the charging signal or a combination thereof so as to make the charging rate of the battery slower than a charging rate of the battery when the degree of degradation X is no less than the first value X1 and less than the second value X2;

when the controller judges the degree of degradation X to be equal to or greater than a third value X3 which is greater than the second value X2, the controller controls the heating signal and the charging signal, so as to make the charging rate of the battery slower than a charging rate of the battery when the degree of degradation X is no less than the second value X2 and less than the third value X3, and so as to charge the battery with the temperature of the battery decreased;

wherein the controller controls the heating signal and the charging signal, so as to charge the battery satisfying $X<X1$ with a battery temperature T1 and a charging current I1, charge the battery satisfying $X1 \leq X<X2$ with a battery temperature T2, charge the battery satisfying $X2 \leq X<X3$ with the charging temperature T2 and a charging current I2, and charge the battery satisfying $X3 \leq X$ with a battery temperature T3 and a charging current I3;

the charging current I1, I2, and I3 satisfy $I3<I2<I1$; and the battery temperature T1, T2, and T3 satisfy $T3 \leq T1<T2$.

3. A control device of battery charging comprising:

a first output unit outputting a heating signal to heat a battery equipped on a vehicle;

a second output unit outputting a charging signal to charge the battery heated according to the heating signal; and a controller judging whether or not a degree of degradation X of the battery is a first value X1 or more and being equipped on a feeding device feeding electricity into the battery, the feeding device being arranged outside the vehicle, wherein when the controller judges the degree of degradation X to be the first value X1 or more, the controller controls the heating signal so as to raise a temperature of the battery, so as to make the charging rate of the battery whose degree of degradation X is no less than the first value X1 equal to or closer to a charging rate of the battery when the degree of degradation is less than the first value X1;

when the controller judges the degree of degradation X to be equal to or greater than a second value X2 which is greater than the first value X1, the controller controls the heating signal or the charging signal or a combination thereof so as to make the charging rate of the battery slower than a charging rate of the battery when the degree of degradation X is no less than the first value X1 and less than the second value X2;

when the controller judges the degree of degradation X to be equal to or greater than a third value X3 which is greater than the second value X2, the controller controls the heating signal and the charging signal, so as to make the charging rate of the battery slower than a charging rate of the battery when the degree of degradation X is no less than the second value X2 and less than the third value X3, and so as to charge the battery with the temperature of the battery decreased;

wherein the controller controls the heating signal and the charging signal, so as to charge the battery satisfying $X<X1$ with a battery temperature T1 and a charging current I1, charge the battery satisfying $X1 \leq X<X2$ with a battery temperature T2, charge the battery satisfying $X2 \leq X<X3$ with the charging temperature T2 and a charging current I2, and charge the battery satisfying $X3 \leq X$ with a battery temperature T3 and a charging current I3;

the charging current I1, I2, and I3 satisfy $I3<I2<I1$; and the battery temperature T1, T2, and T3 satisfy $T3 \leq T1<T2$.

* * * * *